United States Patent
Vignal et al.

(10) Patent No.: US 11,623,436 B2
(45) Date of Patent: Apr. 11, 2023

(54) LAMINATION DEVICE AND PROCESS THEREOF

(71) Applicant: ArcelorMittal, Luxembourg (LU)

(72) Inventors: Renaud Vignal, Sevrier (FR); Paul Wouters, Liege (BE); Lionel Fourdrinier, Saint-Gilles (BE)

(73) Assignee: ArcelorMittal, Luxembourg (LU)

( * ) Notice: Subject to any disclaimer, the term of this patent is extended or adjusted under 35 U.S.C. 154(b) by 0 days.

(21) Appl. No.: 17/299,477

(22) PCT Filed: Dec. 10, 2019

(86) PCT No.: PCT/IB2019/060592
§ 371 (c)(1),
(2) Date: Jun. 3, 2021

(87) PCT Pub. No.: WO2020/121178
PCT Pub. Date: Jun. 18, 2020

(65) Prior Publication Data
US 2022/0048283 A1 Feb. 17, 2022

(30) Foreign Application Priority Data
Dec. 13, 2018 (WO) .................. PCT/IB2018/059995

(51) Int. Cl.
*B32B 37/10* (2006.01)
*B32B 37/00* (2006.01)
(Continued)

(52) U.S. Cl.
CPC ........ *B32B 37/1009* (2013.01); *B32B 37/003* (2013.01); *B32B 37/0046* (2013.01);
(Continued)

(58) Field of Classification Search
CPC .......................... B32B 37/003; B32B 37/1009
(Continued)

(56) References Cited

U.S. PATENT DOCUMENTS 5,264,058 A * 11/1993 Hoagland ......... B32B 17/10018
156/286
6,041,840 A * 3/2000 Ogawa ................ B32B 37/1018
156/382
(Continued)

FOREIGN PATENT DOCUMENTS

CN 101885258 11/2010
CN 102099192 6/2011
(Continued)

OTHER PUBLICATIONS

See Search Report of PCT/IB2019/060592 dated Feb. 19, 2020.

*Primary Examiner* — Philip C Tucker
*Assistant Examiner* — John Blades
(74) *Attorney, Agent, or Firm* — Davidson, Davidson & Kappel, LLC

(57) ABSTRACT

A lamination device for laminating a photovoltaic stack on a profiled metallic panel, the lamination device including a lid covered on its underside with an upper flexible pressure membrane so as to form an airtight upper chamber that may be ventilated or evacuated and/or including an upper heating device whose bottom side has a crenellated profile, the device also including a chassis covered on its top with a lower flexible pressure membrane so as to form an airtight lower chamber that may be ventilated or evacuated and/or including a lower heating device whose upper side has a cross-section which differs from the crenellated profile of the bottom side of the upper heating device, wherein the lid is capable of sealably laying on the chassis so that the cavity thus formed is airtight and may be ventilated or evacuated. A corresponding process is also provided.

29 Claims, 4 Drawing Sheets

(51) Int. Cl.
  *H01L 31/18* (2006.01)
  *H01L 31/046* (2014.01)
  *H02S 20/25* (2014.01)

(52) U.S. Cl.
  CPC ...... *H01L 31/1876* (2013.01); *B32B 2457/12* (2013.01); *H01L 31/046* (2014.12); *H02S 20/25* (2014.12)

(58) Field of Classification Search
  USPC .................. 156/285, 286, 381, 382, 581
  See application file for complete search history.

(56) References Cited

U.S. PATENT DOCUMENTS

| | | | |
|---|---|---|---|
| 6,190,488 | B1 | 2/2001 | Tada et al. |
| 2001/0018948 | A1 | 9/2001 | Tada et al. |
| 2009/0056855 | A1 | 3/2009 | Stevens |
| 2010/0126672 | A1* | 5/2010 | Meisser .............. B30B 5/02 156/583.1 |
| 2010/0288442 | A1 | 11/2010 | Damm et al. |
| 2011/0083717 | A1* | 4/2011 | Nishi .................. H01L 31/0236 257/E31.117 |
| 2012/0247664 | A1* | 10/2012 | Kobayashi .............. H01L 24/75 156/308.2 |
| 2018/0152136 | A1 | 5/2018 | Vignal et al. |

FOREIGN PATENT DOCUMENTS

| | | |
|---|---|---|
| CN | 107667468 | 2/2018 |
| CN | 108269882 | 7/2018 |
| CN | 108859379 | 11/2018 |
| EP | 2030785 | 3/2009 |
| EP | 2236287 | 10/2010 |
| EP | 2327546 A1 | 6/2011 |
| EP | 3403826 A1 | 11/2018 |
| JP | H10315257 A | 12/1998 |
| JP | 2001230438 A | 8/2001 |
| JP | 2012204718 A | 10/2012 |
| JP | 2012242007 A | 12/2012 |
| JP | 2013071387 A | 4/2013 |
| WO | WO 2009/031674 A1 | 3/2009 |
| WO | WO2012/120489 | 9/2012 |

* cited by examiner

LAMINATION DEVICE AND PROCESS THEREOF

The present invention relates to a lamination device for laminating photovoltaic stacks on a panel, in particular on a profiled metallic panel. The present invention also relates to the method for laminating photovoltaic stacks on two differently profiled metallic panels consecutively with one single lamination device.

BACKGROUND

It is known from WO2012/120489 to laminate together the different layers of a photovoltaic solar collector unit, on a profiled metallic panel, via pressure exerted by a roll and by heat supplied by a temperature chamber as illustrated in FIG. 8 of this patent. During this process, the films surrounding the solar cells fuse and embed them in the collector unit. Nevertheless, the roll doesn't provide a pressure homogeneous enough to provide a uniform lamination of the collector unit on the length of the profiled metallic panel, which affects the performances of the collector unit.

SUMMARY OF THE INVENTION

Furthermore, there is a need for lamination devices which can laminate consecutively metallic panels with different profiles without any device shutdown to adapt the device to the profile to be laminated.

It is an object of the present invention to provide a lamination device offering a uniform lamination when laminating profiled metallic panel.

It is an alternate or additional object of the present invention to provide a lamination device which can laminate consecutively metallic panels with different profiles.

The present invention provides a lamination device for laminating a photovoltaic stack on a profiled metallic panel, the lamination device comprising:
  a chassis forming a lower chamber and comprising on its top a lower heating device whose upper side has a crenellated cross-section comprising consecutively at least a first lower end section, a first upper central section and a second lower end section, and
  a lid covered on its underside with an upper flexible pressure membrane so as to form an airtight upper chamber that may be ventilated or evacuated,
  wherein the lid is capable of sealably laying on the chassis so that the lower chamber located below the upper flexible pressure membrane is airtight and can be ventilated or evacuated.

This lamination device may also have the optional features listed below, considered individually or in combination:
  the crenellated cross-section is such that the crenellated cross-section is adapted to the profile of the profiled metallic panel,
  the lower heating device comprises a base, which upper side is substantially flat, and at least one insert bound to the upper side of the base so as to obtain the crenellated cross-section,
  the lower heating device comprises a multiplicity of longitudinal segments, each of them being vertically slidable,
  the lid further comprises a release sheet located below the upper flexible pressure membrane,
  the crenellated cross-section of the lower heating device comprises consecutively a first lower end section, a first upper central section, a lower intermediate section, a second upper central section and a second lower end section,
  the first upper central section and the second upper central section are in the same horizontal plane,
  the lower heating device is covered on its top with a conveyor belt.

The present invention also provides a lamination device for laminating a photovoltaic stack on a profiled metallic panel, the lamination device comprising:
  a chassis covered on its top with a lower flexible pressure membrane so as to form an airtight lower chamber that may be ventilated or evacuated, and
  a lid forming an upper chamber and comprising on its underside an upper heating device whose bottom side has a crenellated profile comprising consecutively at least a first upper end section, a first lower central section and a second upper end section,
  wherein the lid is capable of sealably laying on the chassis so that the upper chamber located above the lower flexible pressure membrane is airtight and can be ventilated or evacuated.

This lamination device may also have the optional features listed below, considered individually or in combination:
  the crenellated profile is such that the crenellated profile is adapted to the profile of the profiled metallic panel,
  the upper heating device comprises a base, which bottom side is substantially flat, and at least one insert bound to the bottom side of the base so as to obtain the crenellated profile,
  the upper heating device comprises a multiplicity of longitudinal segments, each of them being vertically slidable,
  the lid further comprises a release sheet located below the upper heating device,
  the crenellated profile of the upper heating device comprises consecutively a first upper end section, a first lower central section, an upper intermediate section, a second lower central section and a second upper end section,
  the first lower central section and the second lower central section are in the same horizontal plane,
  the lower flexible pressure membrane is covered on its top with a conveyor belt.

The present invention also provides a lamination device for laminating a photovoltaic stack on a profiled metallic panel, the lamination device comprising:
  a lid covered on its underside with an upper flexible pressure membrane so as to form an airtight upper chamber that may be ventilated or evacuated and comprising an upper heating device, located above the upper flexible pressure membrane, whose bottom side has a crenellated profile comprising consecutively at least a first upper end section, a lower central section and a second upper end section, and
  a chassis covered on its top with a lower flexible pressure membrane so as to form an airtight lower chamber that may be ventilated or evacuated and comprising a lower heating device, located below the lower flexible pressure membrane, whose upper side has a cross-section which differs from the crenellated profile of the bottom side of the upper heating device,
  wherein the lid is capable of sealably laying on the chassis so that the cavity between the lower flexible pressure membrane and the upper flexible pressure membrane forms an airtight intermediate chamber that may be ventilated or evacuated.

This lamination device may also have the optional features listed below, considered individually or in combination:

the cross-section of the upper side of the lower heating device is flat, the cross-section of the upper side of the lower heating device comprises a first lower end section, a first upper central section and a second lower end section, the cross-section of the upper side of the lower heating device comprises a first lower end section, a first upper central section, a lower intermediate section, a second upper central section and a second lower end section.

The present invention also provides a process for laminating a photovoltaic stack on a profiled metallic panel, comprising:

(i) providing a lamination device according to the first subject of the invention in which the crenellated cross-section of the lower heating device is adapted to the profile of the profiled metallic panel, (ii) inserting in the lamination device the profiled metallic panel covered with the photovoltaic stack to be laminated, (iii) evacuating the lower chamber and ventilating the upper chamber so that the upper flexible pressure membrane presses the photovoltaic stack against the lower heating device, and (iv) ventilating the lower chamber so that the profiled metallic panel returns to its initial position and can be removed.

This process may also have the optional feature according to which the profiled metallic panel comprises a first longitudinal rib along its first longitudinal edge, a second longitudinal rib along its second longitudinal edge and a central part in-between, intended to be covered at least partially by the photovoltaic stack, and comprising consecutively a first flange, an elevated plateau and a second flange and, during step (iii), the lower end sections of the crenellated cross-section of the lower heating device are in contact with the flanges of the profiled metallic panel.

The present invention also provides a process for laminating a photovoltaic stack on a profiled metallic panel, comprising:

(i) providing a lamination device according to the second subject of the invention in which the crenellated profile of the upper heating device is adapted to the profile of the profiled metallic panel, (ii) inserting in the lamination device the profiled metallic panel covered with the photovoltaic stack to be laminated, (iii) evacuating the upper chamber and ventilating the lower chamber so that the lower flexible pressure membrane presses the photovoltaic stack against the upper heating device, and (iv) ventilating the upper chamber so that the profiled metallic panel returns to its initial position and can be removed.

This process may also have the optional feature according to which the profiled metallic panel comprises a first longitudinal rib along its first longitudinal edge, a central part intended to be covered at least partially by the photovoltaic stack and a second longitudinal rib along its second longitudinal edge and, during step (iii), the upper end sections of the crenellated profile of the upper heating device are in contact with the longitudinal rib of the profiled metallic panel.

The present invention also provides a process for laminating photovoltaic stacks on two differently profiled metallic panels consecutively, comprising:

(i) providing a lamination device according to the third subject of the invention in which the crenellated profile of the upper heating device is adapted to the profile of the first profiled metallic panel and the cross-section of the lower heating device is adapted to the profile of the second profiled metallic panel, (ii) inserting in the lamination device the first profiled metallic panel covered with the photovoltaic stack to be laminated, (iii) evacuating the upper chamber and the airtight intermediate chamber and ventilating the lower chamber so that the lower flexible pressure membrane presses the photovoltaic stack against the upper heating device, (iv) ventilating the upper chamber and the airtight intermediate chamber so that the first profiled metallic panel returns to its initial position and can be removed, (v) inserting in the lamination device the second profiled metallic panel covered with the photovoltaic stack to be laminated, (vi) evacuating the lower chamber and the airtight intermediate chamber and ventilating the upper chamber so that the upper flexible pressure membrane presses the photovoltaic stack against the lower heating device, and (vii) ventilating the lower chamber and the airtight intermediate chamber so that the second profiled metallic panel returns to its initial position and can be removed.

This process may also have the optional features listed below, considered individually or in combination:

the first profiled metallic panel comprises a first longitudinal rib along its first longitudinal edge, a central part intended to be covered at least partially by the photovoltaic stack and a second longitudinal rib along its second longitudinal edge and, during step (iii), the upper end sections of the crenellated profile of the upper heating device are in contact with the longitudinal rib of the first profiled metallic panel, the second profiled metallic panel comprises a first longitudinal rib along its first longitudinal edge, a second longitudinal rib along its second longitudinal edge and a central part in-between, intended to be covered at least partially by the photovoltaic stack, and comprising consecutively a first flange, an elevated plateau and a second flange and, during step (vi), the lower end sections of the cross-section of the lower heating device are in contact with the flanges of the second profiled metallic panel.

BRIEF DESCRIPTION OF THE DRAWINGS

Other characteristics and advantages of the invention will be described in greater detail in the following description, which is provided purely for purposes of explanation and is in no way intended to be restrictive, with reference to.

DETAILED DESCRIPTION

Figure 1:
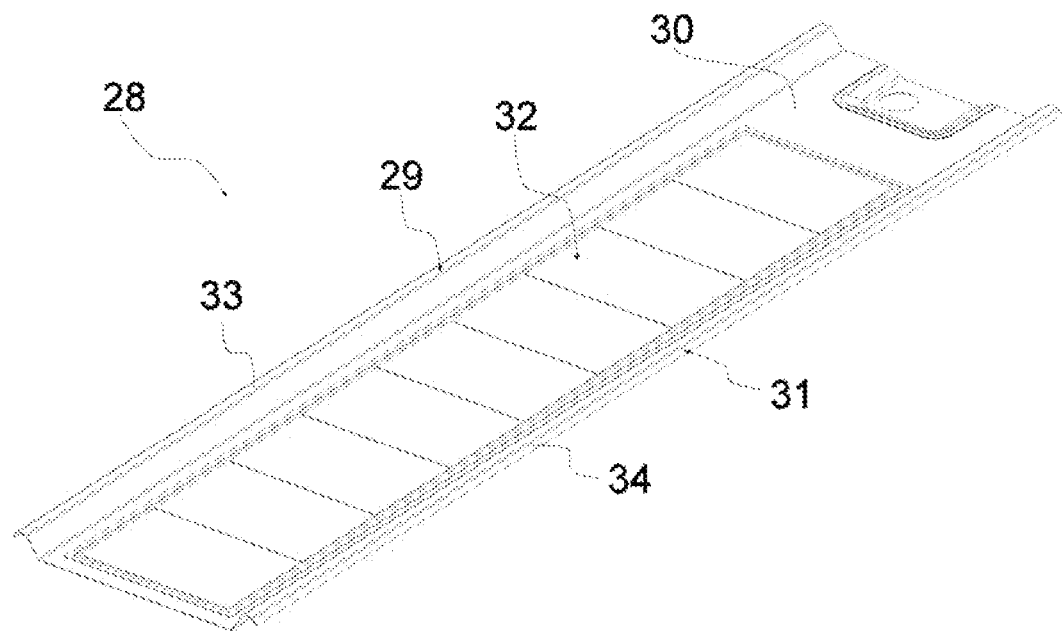
FIG. 1, which is a perspective view of a profiled panel according to one variant of the invention, FIG. 2, which is a cross-section of a profiled panel according to a second variant of the invention, FIG. 3, which is a cross-section of a profiled panel according to a third variant of the invention, FIG. 4, which is a cross-section of a lamination device according to one variant of the invention, FIG. 5, which is a cross-section of an upper heating device according to one variant of the invention, FIG. 6, which is a cross-section of an upper heating device according to another variant of the invention, FIG. 7, which is a cross-section of a lamination device during step (ii) of a process of lamination according to the invention, FIG. 8, which is a cross-section of a lamination device during step (iii) of a process of lamination according to the invention, FIG. 9, which is a cross-section of a lamination device during step (v) of a process of lamination according to the invention, FIG. 10, which is a cross-section of a lamination device during step (vi) of a process of lamination according to the invention.

It should be noted that the terms "upper", "lower", "below", "above", "underneath" . . . as used in this application refer to the positions and orientations of the different constituent elements of the lamination device when the latter is standing on the ground, ready for use.

It should be noted that, as used herein, the term "in contact" inclusively includes "directly in contact" (no intermediate materials or elements disposed therebetween) and "indirectly in contact" (intermediate materials or elements disposed therebetween). For example, having the upper sections of the crenellated profile in contact with the longitudinal ribs can having them in direct contact, as well as having a flexible pressure membrane and/or a release sheet pressed in-between the upper sections and the longitudinal ribs.

Throughout the text, a photovoltaic stack is understood to mean a stack of a plurality of layers which comprises a layer capable of converting solar energy into electricity and protected from the outside by insulating layers. Photovoltaic stacks usually comprise a foil of insulating material called a back-sheet, a first layer of encapsulation material, solar cells connected via ribbons, a second layer of encapsulation material and a transparent foil of insulation material called a front-sheet. The solar cells are usually themselves composed of several layers among which a substrate, a back-electrode, a p-n junction and a front electrode. The cells can notably be wafer-based crystalline silicon cells or thin-film cells.

Throughout the text, a panel is understood to mean an element that has a flat shape, i.e., its thickness is low compared to its other dimensions. Generally speaking, its thickness is 500 to 4000 times lower than its width. The panel may be made of a single material or a composite assembly. In the latter case, the panel is a stack of a plurality of layers of the same material or different materials. The material in question may be, among others, a metallic material or a polymer. Steel, aluminum, copper and zinc may be cited as non-restricting examples of metallic materials. The panel is preferably a metallic sheet. It is preferably made of previously galvanized and pre-coated steel to protect it against corrosion. The panel may optionally be foamed on its bottom surface and thereby constitute the exterior facing of a sandwich panel.

Within the framework of the invention, the panel will have been previously formed with the aid of any known forming method, including, by way of non-restricting examples, bending, forming, stamping and molding so as to obtain a profiled panel. By "profiled", it is meant that the surface of the panel is not flat anymore.

This forming leads for example to the formation of ribs, projecting parts, stiffeners or grooves on the surface of the sheet. Throughout the text, a rib is understood to mean a projection formed on the surface of the sheet. The rib may have a trapezoidal shape or a rectangular, corrugated, sinusoidal or even omega shape, for example. It generally includes a top central part and two lateral wings. A stiffener is a rib of limited height, generally 10 to 30 times lower than a rib. A groove is a recess formed on the surface of the panel. The groove can have shapes similar to the ones offered for ribs. Ribs, stiffeners or grooves are generally placed in parallel to the longitudinal edges of the sheet notably to render the sheet more rigid.

The profiled panel is preferably a construction panel, i.e a panel intended for the construction of building envelopes and more particularly intended to be assembled for the construction of building roofs bearing photovoltaic cells.

The profiled panel 28 comprises principally a first longitudinal edge 29, a central part 30 intended to be at least partially covered by the photovoltaic stack 32 and a second longitudinal edge 31.

According to an embodiment of the invention illustrated in FIG. 1, the panel 28 comprises, in cross-section perpendicular to its longitudinal axis, a first longitudinal rib 33 along its first longitudinal edge 29, a flat central part 30 and a second longitudinal rib 34 along its second longitudinal edge 31. The first and second longitudinal ribs have the same height and corresponding shapes so that one can overlap the other when two panels are assembled on a building structure. According to a variant, the central part 30 comprises a central rib dividing the central part into two flat sub-parts, each of them being intended to be at least partially covered by the photovoltaic stack 32. Preferably, the central rib has the same height as the longitudinal ribs.

Figure 2:
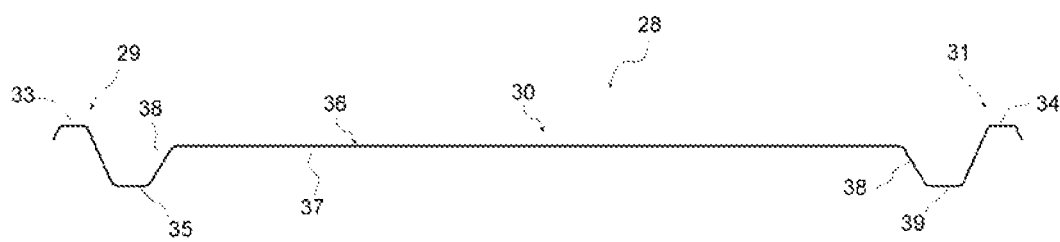

According to another embodiment of the invention illustrated in FIG. 2, the panel comprises, in cross-section perpendicular to its longitudinal axis, a first longitudinal rib 33 along its first longitudinal edge 29, a second longitudinal rib 34 along its second longitudinal edge 31 and a central part 30 in-between comprising consecutively a first flange 35, an elevated plateau 36 comprising an upper portion 37 intended to be at least partially covered by the photovoltaic stack 32 and two lateral wings 38 extending from the upper portion on either side and downwards and a second flange 39. The first and second longitudinal ribs 33, 34 have the same height and corresponding shapes so that one can overlap the other when two panels are assembled on a building structure. The elevated plateau 36 is less elevated than the ribs so that the solar cells covering it are not in the shadow of the ribs while the watertightness of the roof formed by the assembly of panels is maintained. According to a variant illustrated in FIG. 3, the panel comprises two elevated plateaus 36 separated by a central rib 40, preferably of the same height as the longitudinal ribs.

Figure 4:
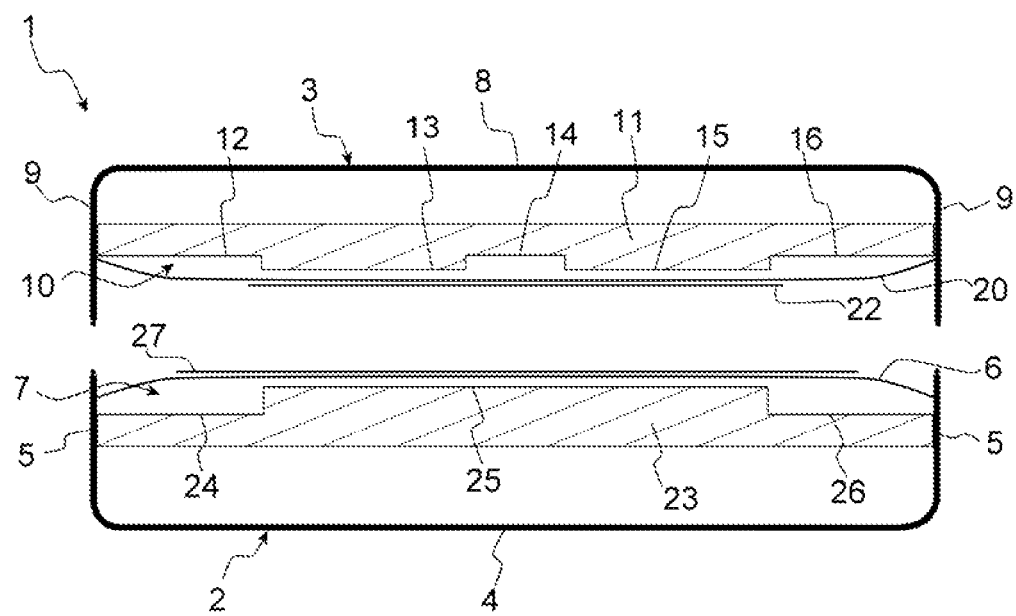

With reference to FIG. 4, the lamination device 1 according to the invention first comprises a chassis 2 and a lid 3 capable of sealably laying on the chassis.

The chassis 2 is schematically a box with a bottom 4 and a lateral wall 5 surrounding the bottom so as to form a convex cavity, referred to in the rest of this description as the lower chamber 7.

The lid 3 is schematically a box with a top 8 and a lateral wall 9 surrounding the top so as to form a concave cavity, referred to in the rest of this description as the upper chamber 10. The shape of the lid 3 is adapted to the shape of the chassis 2 so that the lid is capable of laying on the chassis and enabling the cavity formed by the connection of the chassis and the lid to be airtight. That cavity can be either the lower chamber 7, the upper chamber 10 or an intermediate chamber described later on. The cavity can thus be ventilated and evacuated. By "ventilated" it is meant that air or gas may be admitted into the cavity at atmospheric pressure or at an overpressure. By "evacuated", it is meant that air or gas may be removed from the cavity. In both cases, fluids such as oil may be used instead of air or gas.

In particular, the lower edge of the lateral wall 9 is adapted to the shape of the upper edge of the lateral wall 5 of the chassis. Preferably, a circumferential joint is positioned on the lower edge of the lateral wall of the lid and/or on the upper edge of the lateral wall of the chassis.

According to a first variant of the invention, the chassis is covered on its top with a flexible pressure membrane 6, referred to in the rest of this description as the lower flexible pressure membrane in contrast to an upper flexible pressure membrane described later on. By "flexible pressure membrane", it is meant a film made in a flexible and elastic material capable of adapting its shape and size depending on the pressures applied above and below the film. The material can be, among others, silicone or PTFE. The lower flexible pressure membrane is clamped pressure tight on the chassis with the aid of clamping devices, for example, as a result of which the lower chamber 7 is airtight. This airtight chamber is delimited by the bottom 4 and lateral wall 5 of the chassis and by the lower flexible pressure membrane 6. It can be ventilated or evacuated.

According to the first variant of the invention, the lid comprises on its underside a heating device, for example an electrical heating plate or a heat exchanger device, referred to in the rest of this description as an upper heating device 11 in contrast to a lower heating device described later on. The heating device is attached in the upper chamber 10 at a height such that there is enough space, between the heating device and the lower flexible pressure membrane 6, for the panel to be laminated when the lid 3 lays on the chassis 2.

Thanks to the upper heating device 11 and the lower flexible pressure membrane 6, the profiled panel inserted in the lamination device can be pressed against the upper heating device and the photovoltaic stack can be laminated. This will be described in greater details when describing the lamination process. Such way of laminating "by the above" offers advantages with reference to the quality of the laminates. In particular, the lower flexible pressure membrane uniformly presses the photovoltaic stacks against the upper heating device. This significantly reduces the risk of having the different layers of the photovoltaic stack move relative to each other. Moreover, since the photovoltaic stack is heated only when it is pressed against the upper heating device, it remains flat and can be more effectively and more uniformly cross-linked over the surface area of the photovoltaic stack. Moreover, it is possible to laminate a photovoltaic stack on a sandwich panel comprising an insulation layer between 2 metallic sheets.

Figure 3:
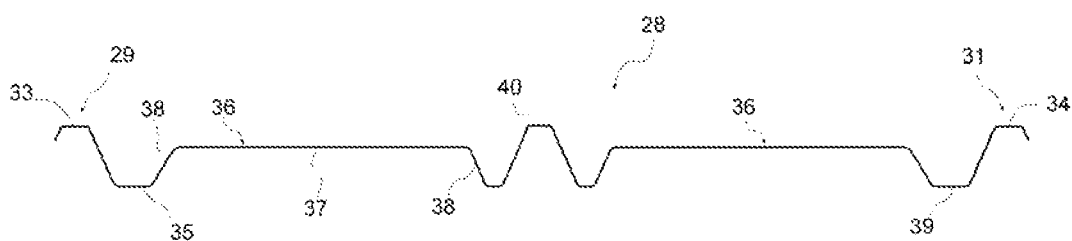

The bottom side of the heating device 11 has a crenellated profile so that it is possible to laminate profiled metallic panels, notably as illustrated in FIGS. 1 to 3. The crenellated profile comprises consecutively at least a first upper end section 12, a first lower central section 13 and a second upper end section 16 so that the crenellated profile is adapted to the profile of the profiled metallic panel. By "adapted" it is meant that the crenellated profile is such that the photovoltaic stack is not prevented from being pressed against the upper heating device by the longitudinal ribs of the profiled metallic panel.

Each section of the crenellated profile is separated from the adjacent one by a wing which can be vertical or not. Preferably, the orientation of the wing differs from the orientation of the corresponding lateral wing of the panel rib so that the crenellated profile can tolerate slight variations in the shape of the profiled panel, these slight variations being due to manufacturing tolerances. In three dimensions, the bottom side of the upper heating device is thus a succession of flat plateaus, alternatively positioned at an upper position and a lower position. Thanks to the crenellated profile, the longitudinal ribs from the profiled panels do not prevent the lower flexible pressure membrane from pressing the photovoltaic stack against the upper heating device while maintaining the longitudinal ribs close enough from a heating source so that there is no significant thermal gradient within the profiled panel. Moreover, the two upper end sections can prevent the profiled metallic panel from significantly bending if the lower flexible pressure membrane is exerting too much pressure on the longitudinal ribs of the panel, which are in cantilevered arrangement with the lower central section of the crenellated profile. In a similar manner to the shape of the profiled panel, the first upper end section and second upper end section are preferably in the same horizontal plane.

When the profiled panel is according to FIG. 3, the crenellated profile comprises consecutively a first upper end section 12, a first lower central section 13, an upper intermediate section 14, a second lower central section 15 and a second upper end section 16. In a similar manner to the shape of the profiled panel, the first lower central section and second lower central section are preferably in the same horizontal plane. Similarly, the first upper end section, the upper intermediate section and the second upper end section are preferably in the same horizontal plane.

According to one embodiment of the invention, there is a gap between the longitudinal ribs of the profiled panel and the upper sections 12, 16, optionally 14, of the upper heating device during the lamination of the photovoltaic stack. The gap is preferably less than 8 mm so that the longitudinal ribs are warmed by the upper heating device which limits thermal gradients within the profiled panel and/or so that the two upper end sections 12, 16 can prevent the profiled metallic panel from significantly bending if the lower flexible pressure membrane is exerting too much pressure on the longitudinal ribs of the panel.

Preferably, the crenellated profile is adjusted so that the profiled panel doesn't curve when it is pressed against the upper heating device 11 thanks to the lower flexible pressure membrane 6. Practically speaking, this means that the upper sections 12, 16, optionally 14, of the crenellated profile are in contact with the longitudinal ribs of the profiled panel while the lower central section 13, optionally 15, is in contact with the photovoltaic stack. In other words, the height between the upper sections and the lower central section corresponds to the height between the top of the longitudinal ribs and the photovoltaic stack. Preventing the panel from curving, i.e. keeping it flat, during the lamination process further helps homogenizing the pressure applied on the photovoltaic stack and helps reducing the number of air bubbles trapped in the photovoltaic stack.

Figure 5:
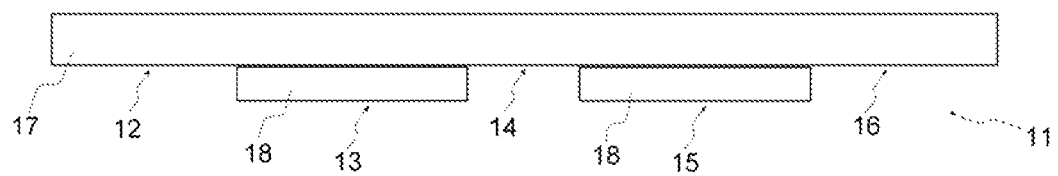

As illustrated on FIG. 5, the upper heating device 11 preferably comprises a base 17, which bottom side is substantially flat, and at least one insert 18 bound to the bottom side of the base so as to obtain the crenellated profile. The insert is preferably bound to the base through mechanical fasteners, such as screws or clamping devices. Alternatively, the base bottom side comprises grooves in which the insert can slide. Thanks to this variant, the profile of the upper heating device can be easily and rapidly modified by replacing the insert(s) in the lamination device by insert(s) with another shape.

The insert 18 can be made of the same material than the base 17 of the heating device or any other material as long as it is heat conductive. It can be for example made of aluminum.

Figure 6:
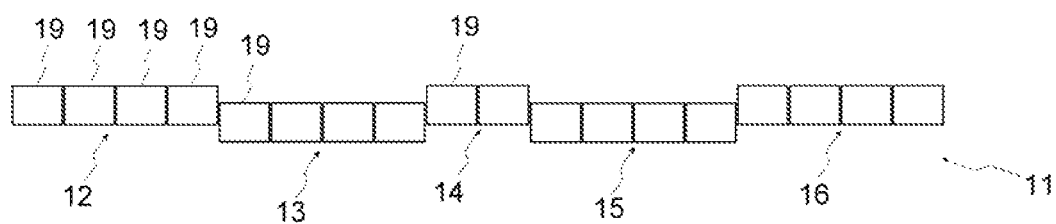

Alternatively, as illustrated on FIG. 6, the upper heating device 11 comprises a multiplicity of longitudinal segments 19, each of them being vertically slidable. The height of each segment can be easily adjusted so that the profile of the upper heating device can be easily and rapidly modified to adapt to another profiled panel.

According to a second variant of the invention, the lid 3 is covered on its underside with a flexible pressure membrane, referred to in the rest of this description as the upper flexible pressure membrane 20. It is similar to the lower flexible pressure membrane. The upper flexible pressure membrane 20 is clamped pressure tight on the lid so that the upper chamber 10 is airtight and may be ventilated or evacuated. It can be clamped pressure tight on the lid lateral wall 9 with the aid of clamping devices, for example. This airtight upper chamber 10 is delimited by the top 8 and lateral wall 9 of the lid 3 and by the upper flexible pressure membrane 10. Thanks to the airtightness of the upper chamber 10, the upper flexible pressure membrane 20 can advantageously be ventilated to press the profiled panel against the chassis 2 as it will be described in more details later on in relation to the lamination process. Consequently, when the lid is sealably laying on the chassis, the lower chamber 7 of the chassis, located below the upper flexible pressure membranes, is airtight and may be ventilated or evacuated.

According to the second variant of the invention, the chassis comprises a lower heating device 23, for example an electrical heating plate or a heat exchanger device. The lower heating device is located in the lower chamber 7 and is positioned high enough in the chamber so that a profiled panel can be pressed against it during the lamination process. It is intended and capable of supplying the photovoltaic stack with the heat necessary for lamination. In other words, it can heat the photovoltaic stack to a cross-linking temperature.

According to this second variant, the upper side of the lower heating device 23 has a crenellated cross-section so that it is possible to laminate profiled panels, notably as illustrated in FIGS. 2 and 3.

When the profiled panel is according to FIG. 2, the upper side of the lower heating device can comprise a first lower end section 24, a first upper central section 25 and a second lower end section 26, as illustrated on FIG. 4, so that the crenellated cross-section is adapted to the profile of the profiled metallic panel. Each section is separated from the adjacent one by a wing which can be vertical or not. Preferably, the orientation of the wing differs from the orientation of the corresponding lateral wing of the panel rib so that the cross-section of the upper side of the lower heating device can tolerate slight variations in the shape of the profiled panel, these slight variations being due to manufacturing tolerances. In 3D, the upper side of the lower heating device is thus a succession of flat plateaus, alternatively positioned at an upper position and a lower position. Thanks to this cross-section, the longitudinal ribs from the profiled panels do not prevent the upper flexible pressure membrane from pressing the photovoltaic stack and the upper portion of the elevated plateau of the profiled panel against the lower heating device while maintaining the flanges 35, 39 close enough from a heating source so that there is no significant thermal gradient within the profiled panel. Moreover, the two lower end sections 24, 26 can prevent the profiled metallic panel from significantly bending if the upper flexible pressure membrane is exerting too much pressure on the longitudinal ribs of the panel, which are in cantilevered arrangement with the upper central section 25 of the upper side of the lower heating device.

When the profiled panel is according to FIG. 3, the upper side of the lower heating device 23 comprises consecutively a first lower end section, a first upper central section, a lower intermediate section, a second upper central section and a second lower end section. In a similar manner to the shape of the profiled panel, the first upper central section and second upper central section are preferably in the same horizontal plane. Similarly, the first lower end section, the lower intermediate section and the second lower end section are preferably in the same horizontal plane.

According to one embodiment of the invention, there is a gap between the flanges 35, 39 of the profiled panel and the lower end sections 24, 26, optionally lower intermediate section, of the lower heating device during the lamination of the photovoltaic stack. The gap is preferably less than 8 mm so that the flanges are warmed by the lower heating device 23 which limits thermal gradients within the profiled panel and/or so that the two lower end sections 24, 26 can prevent the profiled metallic panel from significantly bending if the upper flexible pressure membrane is exerting too much pressure on the longitudinal ribs of the panel.

Preferably, the cross-section of the upper side of the lower heating device 23 is adjusted so that the profiled panel doesn't curve when it is pressed against the lower heating device 23 thanks to the upper flexible pressure membrane 20. Practically speaking, this means that the lower sections 24, 26, optionally lower intermediate section, of the cross-section are in contact with the flanges 35, 39 of the profiled panel while the upper central section 25, optionally the second upper central section, is in contact with the upper section of the elevated plateau of the profiled panel. In other words, the height between the lower end sections and the upper central section corresponds to the height between the flanges and the upper section of the elevated plateau. Preventing the panel from curving, i.e. keeping it flat, during the lamination process further helps homogenizing the pressure applied on the photovoltaic stack and helps reducing the number of air bubbles trapped in the photovoltaic stack.

Like the upper heating device 11 illustrated on FIG. 5, the lower heating device 23 can comprise a base, which upper side is substantially flat, and at least one insert bound to the upper side of the base so as to obtain the cross-section. The insert is preferably bound to the base through mechanical fasteners, such as screws or clamping devices. Alternatively, the base upper side comprises grooves in which the insert can slide. Thanks to this variant, the cross-section of the lower heating device can be easily and rapidly modified by replacing the insert(s) in the lamination device by insert(s) with another shape.

Alternatively and like the upper heating device 11 illustrated on FIG. 6, the lower heating device 23 can comprise a multiplicity of longitudinal segments 19, each of them being vertically slidable. The height of each segment can be easily adjusted so that the cross-section of the lower heating device can be easily and rapidly modified to adapt to another profiled panel.

According to a third variant of the invention, the lid 3 comprises on its underside the upper heating device 11, as described above, and the upper flexible pressure membrane 20, as described above, underneath the upper heating device. As for the chassis 2, it is covered on its top with the lower flexible pressure membrane 6, as described above, and it further comprises the lower heating device 23, as described above, located below the lower flexible pressure membrane.

Consequently, when the lid is sealably laying on the chassis, the room between the lower and the upper flexible pressure membranes forms an airtight intermediate chamber 21 that may be ventilated or evacuated.

According to this third variant, the upper side of the lower heating device 23 has a cross-section which differs from the crenellated profile of the bottom side of the upper heating device 11 so that it is possible to laminate profiled panels, notably as illustrated in FIGS. 1 to 3, whose profiles differ from the one of the profiled panels laminated thanks to the upper heating device.

When the profiled panel is according to FIG. 2 or FIG. 3, the upper side of the lower heating device can have the cross-sections similar to those described for the second variant of the invention.

Especially for this third variant, when the profiled panel is according to FIG. 1, the upper side of the lower heating device 23 can be flat since the longitudinal ribs from the profiled panel do not prevent the upper flexible pressure membrane 20 from pressing the photovoltaic stack 32 and the flat central part 30 of the profiled panel against the lower heating device 23.

According to one embodiment of the invention, the lid further comprises a release sheet 22 located below the upper heating device 11 or below the upper flexible pressure membrane 20. During the lamination process, the release sheet is thus positioned in-between the photovoltaic stack and either the upper heating device or the upper flexible pressure membrane. It absorbs the lamination residues, such as film residues, that are expelled from the photovoltaic stack during pressing, thereby protecting the heating device or the upper flexible pressure membrane from being contaminated. The release sheet is preferably made of a glass fiber fabric. It can be unwound from a coil at the entry of the lamination device and rewound at the exit of the lamination device so that the part of the release sheet located in the lamination device can be replaced very easy from time to time. This facilitates the cleaning of the release sheet. It can also be in the form of an endless belt.

According to one embodiment of the invention, the lower flexible pressure membrane 6 or the lower heating device 23 is covered on its top with a conveyor belt 27. The conveyor belt runs through the lamination device and transports the profiled panel through, into or out of the lamination device. It can be in the form of an endless belt. It can be, for example, made of carbon fibers.

The crenellated cross-section of the lower heating device 23 is not covered on its top by any other part of the lamination device than the lower flexible membrane 6, if any, and the conveyor belt 27, if any. In other words, the first lower end section 24 and the second lower end section 26 are not covered on their top by structural parts of the lamination device, i.e. by any part of the lamination device that would prevent the profiled metallic panel, and in particular its flat central part 30, from being pressed against the first upper central section 25.

Similarly, the crenellated profile of the upper heating device 11 is not covered on its underside by any other part of the lamination device than the upper flexible pressure membrane 20, if any, and the release sheet 22, if any. In other words, the first upper end section 12 and the second upper end section 16 are not covered on their underside by structural parts of the lamination device, i.e. by any part of the lamination device that would prevent the profiled metallic panel and in particular its flat central part 30, from being pressed against the first lower central section 13 and against the second lower central section 15, if any.

During the lamination process, a profiled panel 28 whose profile is compatible with the profile of the heating device and at least one photovoltaic stack 32 positioned on the central part of the panel are introduced into the lamination device 1. This can optionally be done thanks to the conveyor belt 27. The lamination device is then air-tightly closed by closing the lid 3 on the chassis 2. Then, the airtight chamber (respectively chambers) comprising the profiled panel and/or the heating device is (respectively are) evacuated while the remaining airtight chamber is ventilated. Consequently, the photovoltaic stack is pressed against the heating device and is laminated by the action of heat. Then, the evacuated chamber (respectively chambers) is (respectively are) ventilated again so that the profiled panel returns to its initial position and can be removed.

When the lamination device is according to the first variant of the invention, the upper chamber 10 is evacuated and the lower chamber 7 is ventilated as a result of which the profiled panel is lifted by the lower flexible pressure membrane 6 and the photovoltaic stack is pressed against the upper heating device 11. In the next step, the upper chamber 10 is ventilated so that the profiled panel returns to its initial position and can be removed. Optionally, the ventilation of the lower chamber is adjusted, by decreasing the pressure, or the lower chamber is evacuated so that the lower flexible pressure membrane more easily returns to its initial position.

When the lamination device is according to the second variant of the invention, the upper chamber 10 is ventilated and the lower chamber 7 is evacuated so that the upper flexible pressure membrane 20 presses the photovoltaic stack 32 against the lower heating device 23. In the next step, the lower chamber 7 is ventilated so that the profiled panel returns to its initial position and can be removed. Optionally, the ventilation of the upper chamber is adjusted, by decreasing the pressure, or the upper chamber is evacuated so that the lower flexible pressure membrane more easily returns to its initial position.

Figure 7:
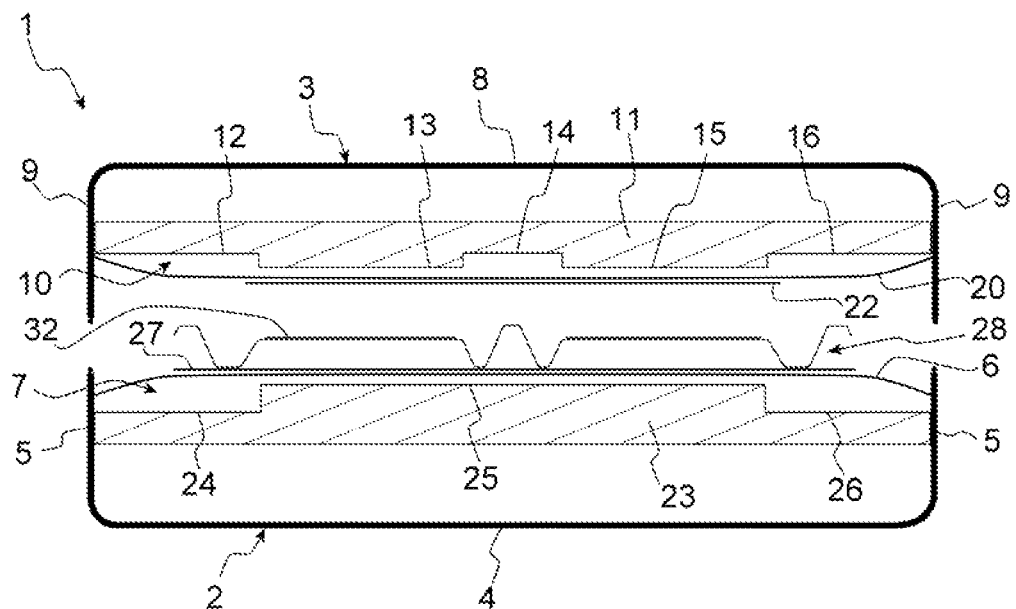
Figure 8:
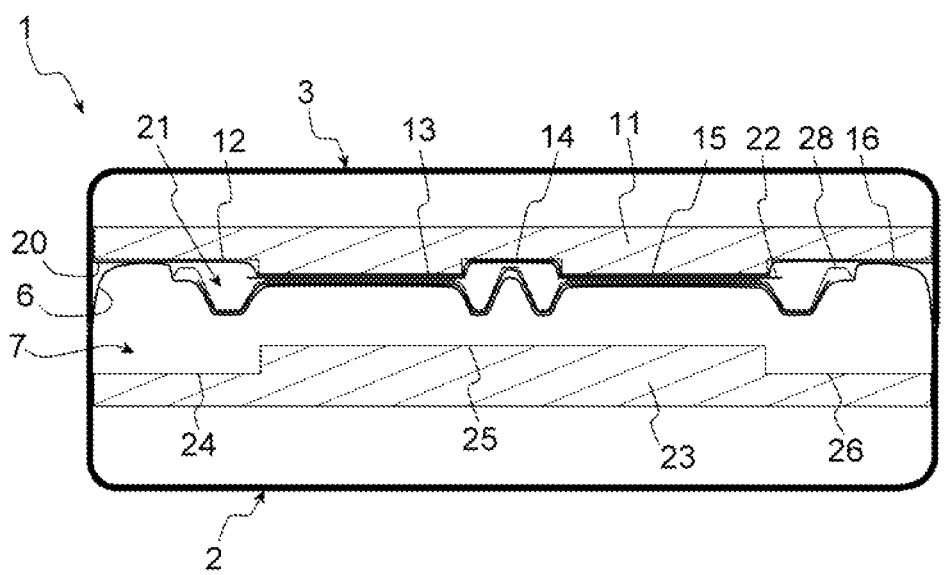
Figure 9:
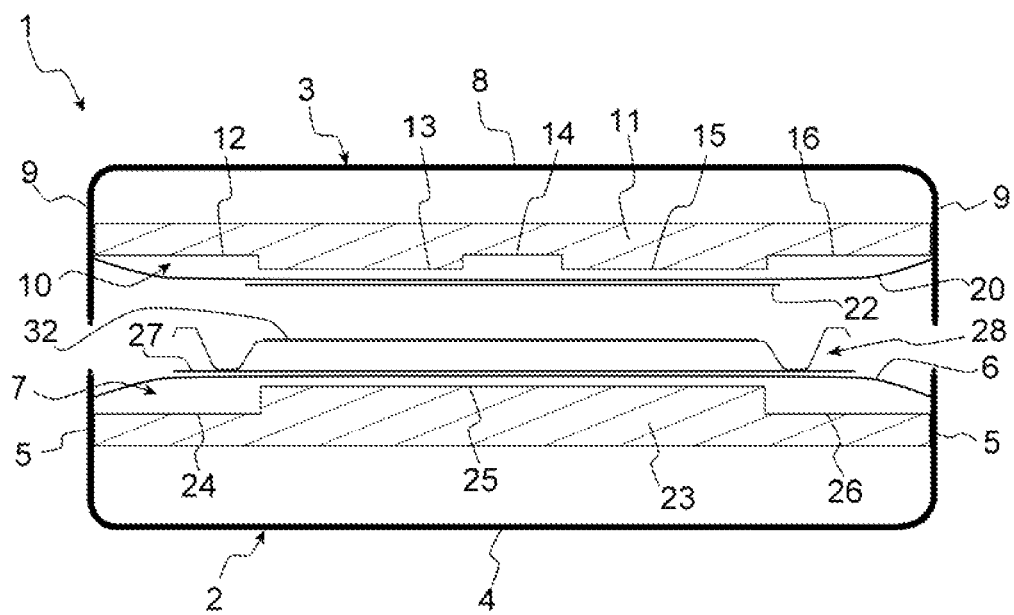
Figure 10:
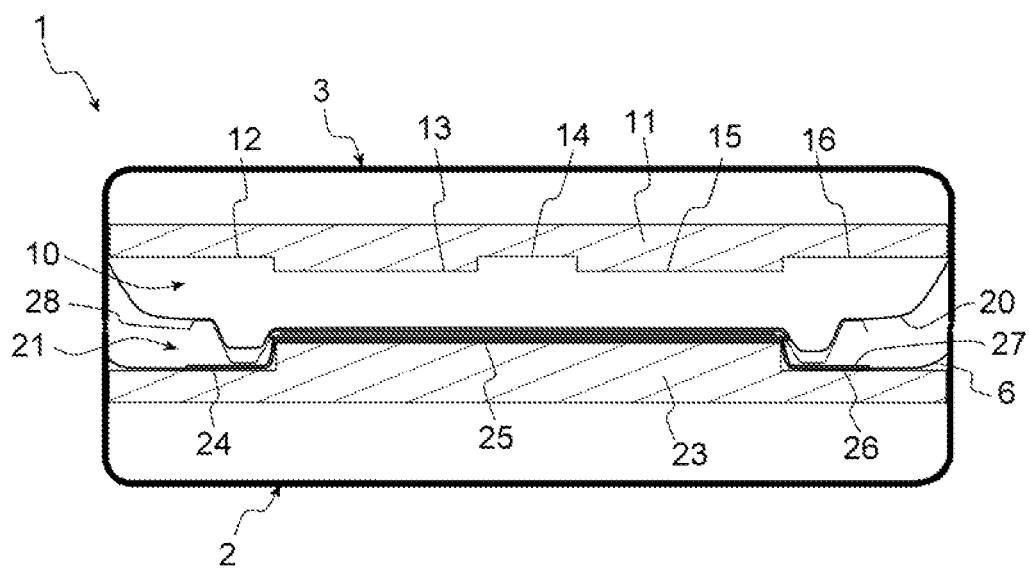

When the lamination device is according to the third variant of the invention, and as illustrated on FIG. 7, a profiled panel 28, whose profile is compatible with the profile of the upper heating device 11, and at least one photovoltaic stack 32 positioned on the central part of the panel are introduced into the lamination device 1 so as to lay above the lower flexible pressure membrane 6. This can optionally be done thanks to the conveyor belt 27. The lamination device is then air-tightly closed by closing the lid 3 on the chassis 2. Then, as illustrated in FIG. 8, the intermediate chamber 21 and the upper chamber 10 are evacuated and the lower chamber 7 is ventilated, as a result of which the profiled panel is lifted by the lower flexible pressure membrane 6 and the photovoltaic stack is pressed against the upper heating device 11 and is laminated by the action of heat.

After the photovoltaic stack 32 has been pressed against the upper heating device 11, the intermediate chamber 21 and the upper chamber 10 are ventilated and the lower chamber 7 may be evacuated so that the profiled panel is back in its initial position.

Once the profiled panel has been removed from the lamination device, a differently profiled panel can be laminated. Accordingly, a differently profiled panel 28, whose profile is compatible with the cross-section of the lower heating device, and at least one photovoltaic stack 32 positioned on the central part 30 of the panel are introduced into the lamination device so as to lay above the lower flexible pressure membrane 6. The lamination device is then air-tightly closed by closing the lid on the chassis. Then the upper chamber 10 is ventilated while the intermediate chamber 21 and the lower chamber 7 are evacuated as a result of which the profiled panel and the photovoltaic stack are pressed against the lower heating device 23 by the upper flexible pressure membrane 20. After the photovoltaic stack has been laminated against the lower heating device, the lower chamber 7 and the intermediate chamber 21 are ventilated and the upper chamber 10 may be evacuated so that the differently profiled panel is back in its initial position.

Thanks to a lamination device according to the third variant, it is thus very easy to switch production from one kind of profiled panels to another. This is done very rapidly without any device shutdown to adapt the device to the new profile. Moreover, when the first profiled panel is laminated against the upper heating device 11, the photovoltaic stack 32 is not in direct contact with the upper heating device. It has been observed that it did improve the quality of the laminated photovoltaic stack, in particular in that it further reduces the number of air bubbles trapped in the photovoltaic stack.

Preferably, when the differently profiled panel is introduced in the lamination device, the lower flexible pressure membrane 6 is ventilated so that the profiled panel is at some distance from the lower heating device 23 and doesn't reach the cross-linking temperature before it is pressed against the lower heating device. This limits the trapping of air bubbles in the photovoltaic stack.

What is claimed is:

1. A lamination device for laminating a photovoltaic stack on a profiled metallic panel, the lamination device comprising:
    a chassis forming a lower chamber and including on a top of the lower chamber a lower heating device having an upper side having a crenellated cross-section including consecutively at least a first lower end section, a first upper central section and a second lower end section so that the crenellated cross-section is adapted to a profile of the profiled metallic panel; and
    a lid covered on an underside with an upper flexible pressure membrane so as to form an airtight upper chamber capable of being ventilated or evacuated, the lid being capable of sealably laying on the chassis so that the lower chamber located below the upper flexible pressure membrane is airtight and is capable of being ventilated or evacuated.

2. The lamination device as recited in claim 1 wherein the lower heating device includes a base having a flat upper base side, and at least one insert bound to the upper base side so as to obtain the crenellated cross-section.

3. The lamination device as recited in claim 1 wherein the lower heating device includes a multiplicity of longitudinal segments, each segment being vertically slidable.

4. The lamination device as recited in claim 1 wherein the lid further includes a release sheet located below the upper flexible pressure membrane.

5. The lamination device as recited in claim 1 wherein the crenellated cross-section of the lower heating device includes consecutively the first lower end section, the first upper central section, a lower intermediate section, a second upper central section and the second lower end section.

6. The lamination device as recited in claim 5 wherein the first upper central section and the second upper central section are in a same horizontal plane.

7. The lamination device as recited in claim 1 wherein the lower heating device is covered on the top with a conveyor belt.

8. The lamination device according to claim 1, wherein the crenellated profile is adapted to a profile of the profiled metallic panel such that during lamination, the first upper central section is pressed against the profiled metallic panel and a gap is present between the profiled metallic panel and the first and second lower end sections.

9. The lamination device according to claim 1, wherein the first lower end section and the second lower end section are not covered on their top by structural parts of the lamination device.

10. A lamination device for laminating a photovoltaic stack on a profiled metallic panel, the lamination device comprising:
    a chassis covered on a top with a lower flexible pressure membrane so as to form an airtight lower chamber capable of being ventilated or evacuated; and
    a lid forming an upper chamber and including on an underside an upper heating device having a bottom side having a crenellated profile including consecutively at least a first upper end section, a first lower central section and a second upper end section so that the crenellated profile is adapted to a profile of the profiled metallic panel, the lid being capable of sealably laying on the chassis so that the upper chamber located above the lower flexible pressure membrane is airtight and capable of being ventilated or evacuated.

11. The lamination device as recited in claim 10 wherein the upper heating device includes a base having a flat bottom base side, and at least one insert bound to the bottom base side so as to obtain the crenellated profile.

12. The lamination device as recited in claim 11 wherein the upper heating device includes a multiplicity of longitudinal segments, each segment being vertically slidable.

13. The lamination device as recited in claim 10 wherein the lid further includes a release sheet located below the upper heating device.

14. The lamination device as recited in claim 10 wherein the crenellated profile of the upper heating device includes consecutively the first upper end section, the first lower central section, an upper intermediate section, a second lower central section and the second upper end section.

15. The lamination device as recited in claim 14 wherein the first lower central section and the second lower central section are in the same horizontal plane.

16. The lamination device as recited in claim 10 wherein the lower flexible pressure membrane is covered on a top with a conveyor belt.

17. The lamination device according to claim 10, wherein the crenellated profile is adapted to a profile of the profiled metallic panel such that during lamination, the first lower central section is pressed against the profiled metallic panel and a gap is present between the profiled metallic panel and the first and second upper end sections.

18. The lamination device according to claim 10, wherein the first upper end section and the second upper end section are not covered on their underside by structural parts of the lamination device.

19. A lamination device for laminating a photovoltaic stack on a profiled metallic panel, the lamination device comprising:
   a lid covered on an underside with an upper flexible pressure membrane so as to form an airtight upper chamber capable of being ventilated or evacuated and including an upper heating device, located above the upper flexible pressure membrane, and having a bottom side having a crenellated profile including consecutively at least a first upper end section, a lower central section and a second upper end section; and
   a chassis covered on a top with a lower flexible pressure membrane so as to form an airtight lower chamber capable of being ventilated or evacuated and including a lower heating device, located below the lower flexible pressure membrane, and having an upper side having a cross-section differing from the crenellated profile of the bottom side of the upper heating device;
   wherein the lid is capable of sealably laying on the chassis so that a cavity between the lower flexible pressure membrane and the upper flexible pressure membrane forms an airtight intermediate chamber capable of being ventilated or evacuated.

20. The lamination device as recited in claim 19 wherein the cross-section of the upper side of the lower heating device is flat.

21. The lamination device as recited in claim 19 wherein the cross-section of the upper side of the lower heating device includes a first lower end section, a first upper central section and a second lower end section.

22. The lamination device as recited in claim 19 wherein the cross-section of the upper side of the lower heating device includes a first lower end section, a first upper central section, a lower intermediate section, a second upper central section and a second lower end section.

23. A process for laminating a photovoltaic stack on a profiled metallic panel, the process comprising:
   (i) providing a lamination device as recited in claim 1, the crenellated cross-section of the lower heating device adapted to a profile of the profiled metallic panel;
   (ii) inserting in the lamination device the profiled metallic panel covered with the photovoltaic stack to be laminated;
   (iii) evacuating the lower chamber and ventilating the upper chamber so that the upper flexible pressure membrane moves the profiled metallic panel away from the lid and presses the photovoltaic stack against the lower heating device; and
   (iv) ventilating the lower chamber so that the profiled metallic panel returns to an initial position and can be removed.

24. The method as recited in claim 23 wherein the profiled metallic panel includes a first longitudinal rib along a first longitudinal edge, a second longitudinal rib along a second longitudinal edge and a central part in between, intended to be covered at least partially by the photovoltaic stack, and including consecutively a first flange, an elevated plateau and a second flange and wherein, during step (iii), the first and second lower end sections of the crenellated cross-section of the lower heating device are in contact with the first and second flanges of the profiled metallic panel.

25. A process for laminating a photovoltaic stack on a profiled metallic panel, the process comprising:
   (i) providing the lamination device as recited in claim 10, the crenellated profile of the upper heating device being adapted to the profile of the profiled metallic panel;
   (ii) inserting in the lamination device the profiled metallic panel covered with the photovoltaic stack to be laminated;
   (iii) evacuating the upper chamber and ventilating the lower chamber so that the lower flexible pressure membrane moves the profiled metallic panel away from the chassis and presses the photovoltaic stack against the upper heating device; and
   (iv) ventilating the upper chamber so that the profiled metallic panel returns to an initial position and can be removed.

26. The process as recited in claim 25 wherein the profiled metallic panel includes a first longitudinal rib along a first longitudinal edge, a central part intended to be covered at least partially by the photovoltaic stack and a second longitudinal rib along a second longitudinal edge and wherein, during step (iii), the first and second upper end sections of the crenellated profile of the upper heating device are in contact with the first and second longitudinal ribs of the profiled metallic panel.

27. A process for laminating photovoltaic stacks on two differently profiled metallic panels consecutively, the process comprising:
   (i) providing a lamination device as recited in claim 19, the crenellated profile of the upper heating device being adapted to the profile of the first profiled metallic panel and the cross-section of the lower heating device being adapted to the profile of the second profiled metallic panel;
   (ii) inserting in the lamination device a first profiled metallic panel covered with a first photovoltaic stack to be laminated;
   (iii) evacuating the upper chamber and the airtight intermediate chamber and ventilating the lower chamber so that the lower flexible pressure membrane moves the profiled metallic panel away from the chassis and presses the first photovoltaic stack against the upper heating device;
   (iv) ventilating the upper chamber and the airtight intermediate chamber so that the first profiled metallic panel returns to its initial position and then removing the first profiled metallic panel from the lamination device;
   (v) inserting in the lamination device a second, differently, profiled metallic panel covered with a second photovoltaic stack to be laminated,
   (vi) evacuating the lower chamber and the airtight intermediate chamber and ventilating the upper chamber so that the upper flexible pressure membrane moves the profiled metallic panel away from the lid and presses the second photovoltaic stack against the lower heating device; and
   (vii) ventilating the lower chamber and the airtight intermediate chamber so that the second profiled metallic panel returns to an initial position and can be removed.

28. The process as recited in claim 27 wherein the first profiled metallic panel includes a first longitudinal rib along a first longitudinal edge, a central part intended to be covered at least partially by the first photovoltaic stack and a second longitudinal rib along a second longitudinal edge and wherein, during step (iii), the first and second upper end sections of the crenellated profile of the upper heating device are in contact with the first and second longitudinal ribs of the first profiled metallic panel.

29. The process as recited in claim 27 wherein the second profiled metallic panel comprises a first longitudinal rib along a first longitudinal edge, a second longitudinal rib along a second longitudinal edge and a central part in between, intended to be covered at least partially by the second photovoltaic stack, and including consecutively a first flange, an elevated plateau and a second flange and wherein, during step (vi), the first and second lower end sections of the cross-section of the lower heating device are in contact with the flanges of the second profiled metallic panel.

\* \* \* \* \*